(12) United States Patent
Liang et al.

(10) Patent No.: US 9,352,539 B2
(45) Date of Patent: May 31, 2016

(54) MICROCAVITY CARRIER WITH IMAGE ENHANCEMENT FOR LASER ABLATION

(71) Applicants: Rong-Chang Liang, Cupertino, CA (US); Chin-Jen Tseng, Fremont, CA (US); Ta-Ching Wu, Fremont, CA (US); Jia Yen Leong, San Jose, CA (US); Zhiyao An, Los Altos, CA (US); An-Yu Ma, East Brunswick, NJ (US); Maung Kyaw Aung, Union City, CA (US)

(72) Inventors: Rong-Chang Liang, Cupertino, CA (US); Chin-Jen Tseng, Fremont, CA (US); Ta-Ching Wu, Fremont, CA (US); Jia Yen Leong, San Jose, CA (US); Zhiyao An, Los Altos, CA (US); An-Yu Ma, East Brunswick, NJ (US); Maung Kyaw Aung, Union City, CA (US)

(73) Assignee: TRILLION SCIENCE, INC., Fremont, CA (US)

( * ) Notice: Subject to any disclaimer, the term of this patent is extended or adjusted under 35 U.S.C. 154(b) by 392 days.

(21) Appl. No.: 13/796,873

(22) Filed: Mar. 12, 2013

(65) Prior Publication Data
US 2014/0261992 A1    Sep. 18, 2014

(51) Int. Cl.
*B32B 3/00* (2006.01)
*B32B 38/10* (2006.01)
(Continued)

(52) U.S. Cl.
CPC . *B32B 38/10* (2013.01); *B32B 3/26* (2013.01); *B32B 7/12* (2013.01); *B32B 27/08* (2013.01); *B32B 27/20* (2013.01); *B32B 27/205* (2013.01); *B32B 27/281* (2013.01); *B32B 27/285* (2013.01); *B32B 27/286* (2013.01); *B32B 27/302* (2013.01); *B32B 27/34* (2013.01); *B32B 27/36* (2013.01); *B32B 27/365* (2013.01); *B32B 27/38* (2013.01); *C08J 7/04* (2013.01); *B32B 2255/10* (2013.01); *B32B 2255/26* (2013.01);
(Continued)

(58) Field of Classification Search
CPC ...... B32B 38/10; B32B 27/205; B32B 27/08; B32B 27/365; B32B 27/38; B32B 27/36; B32B 3/26; B32B 7/12; B32B 27/302; B32B 27/285; B32B 27/281; B32B 27/286; B32B 27/20; B32B 27/34; B32B 3/00; B32B 2310/0843; B32B 2307/202; H05K 3/323; Y10T 428/249978
USPC .................................. 428/166, 172, 175, 156
See application file for complete search history.

(56) References Cited

U.S. PATENT DOCUMENTS

| 4,247,234 A | 1/1981 | Hoffman |
| 4,740,657 A | 4/1988 | Tsukagoshi et al. |

(Continued)

FOREIGN PATENT DOCUMENTS

| WO | 00/00563 | 1/2000 |
| WO | 2007/130127 | 11/2007 |

OTHER PUBLICATIONS

PCT, International Search Report and Written Opinion, Sep. 3, 2014.
(Continued)

*Primary Examiner* — Catherine A Simone
(74) *Attorney, Agent, or Firm* — Thompson Hine LLP

(57) ABSTRACT

A carrier belt for fabricating a device or component such as an anisotropic conductive film. The carrier belt includes a substrate having a sacrificial image enhancing layer. Microcavities are formed in the carrier by laser ablation through the image enhancing layer. After the image enhancement layer is removed, a plurality of conductive particles are distributed into an array of microcavities formed by laser ablation on a surface of a carrier belt and transferred to an adhesive layer. The image enhancing layer enables one to form microcavities with a fine pitch and spacing and partitions having a high aspect ratio.

10 Claims, 6 Drawing Sheets

(51) Int. Cl.

| | |
|---|---|
| B32B 3/26 | (2006.01) |
| C08J 7/04 | (2006.01) |
| B32B 7/12 | (2006.01) |
| B32B 27/08 | (2006.01) |
| B32B 27/20 | (2006.01) |
| B32B 27/28 | (2006.01) |
| B32B 27/30 | (2006.01) |
| B32B 27/34 | (2006.01) |
| B32B 27/36 | (2006.01) |
| B32B 27/38 | (2006.01) |
| H05K 3/32 | (2006.01) |

(52) U.S. Cl.
CPC ... *B32B 2264/025* (2013.01); *B32B 2264/0235* (2013.01); *B32B 2264/0257* (2013.01); *B32B 2264/0264* (2013.01); *B32B 2264/0292* (2013.01); *B32B 2264/105* (2013.01); *B32B 2270/00* (2013.01); *B32B 2307/202* (2013.01); *B32B 2307/714* (2013.01); *B32B 2310/0843* (2013.01); *B32B 2413/00* (2013.01); *H05K 3/323* (2013.01); *Y10T 428/24998* (2015.04); *Y10T 428/249978* (2015.04); *Y10T 428/31504* (2015.04); *Y10T 428/31507* (2015.04); *Y10T 428/31663* (2015.04); *Y10T 428/31721* (2015.04); *Y10T 428/31725* (2015.04); *Y10T 428/31786* (2015.04); *Y10T 428/31935* (2015.04); *Y10T 428/31938* (2015.04); *Y10T 428/31942* (2015.04)

(56) References Cited

U.S. PATENT DOCUMENTS

| | | | |
|---|---|---|---|
| 4,877,761 | A | 10/1989 | Chmiel et al. |
| 5,216,065 | A | 6/1993 | Colyer et al. |
| 5,219,462 | A | 6/1993 | Bruxvoort et al. |
| 5,437,754 | A | 8/1995 | Calhoun |
| 5,820,450 | A | 10/1998 | Calhoun |
| 5,882,802 | A | 3/1999 | Ostolski |
| 6,042,894 | A | 3/2000 | Goto et al. |
| 6,274,508 | B1 | 8/2001 | Jacobsen et al. |
| 6,281,038 | B1 | 8/2001 | Jacobsen et al. |
| 6,352,775 | B1 | 3/2002 | Sasaki et al. |
| 6,555,408 | B1 | 4/2003 | Jacobsen et al. |
| 6,566,744 | B2 | 5/2003 | Gengel |
| 6,632,532 | B1 | 10/2003 | Yamada et al. |
| 6,672,921 | B1 | 1/2004 | Liang et al. |
| 6,683,663 | B1 | 1/2004 | Hadley et al. |
| 6,751,008 | B2 | 6/2004 | Liang et al. |
| 6,770,369 | B1 | 8/2004 | Oyamada et al. |
| 6,784,953 | B2 | 8/2004 | Liang et al. |
| 6,788,452 | B2 | 9/2004 | Liang et al. |
| 6,833,943 | B2 | 12/2004 | Liang et al. |
| 6,906,427 | B2 | 6/2005 | Tanaka et al. |
| 7,923,488 | B2 | 4/2011 | Xu et al. |
| 8,044,154 | B2 | 10/2011 | McNamara et al. |
| 8,067,484 | B2 | 11/2011 | Ying et al. |
| 8,084,553 | B2 | 12/2011 | Liang et al. |
| 2006/0054867 | A1 | 3/2006 | Yamada |
| 2006/0280912 | A1 | 12/2006 | Liang et al. |
| 2009/0053859 | A1 | 2/2009 | Xu et al. |
| 2009/0140216 | A1* | 6/2009 | Kim et al. ............ 252/511 |
| 2009/0181165 | A1 | 7/2009 | Liang et al. |
| 2010/0101700 | A1 | 4/2010 | Liang et al. |
| 2010/0317545 | A1 | 12/2010 | McNamara et al. |
| 2011/0253943 | A1 | 10/2011 | Liang et al. |
| 2012/0007259 | A1 | 1/2012 | Ying et al. |
| 2012/0029116 | A1 | 2/2012 | Liang et al. |
| 2012/0295098 | A1 | 11/2012 | Hwang et al. |
| 2013/0071636 | A1 | 3/2013 | Lee et al. |
| 2013/0146816 | A1 | 6/2013 | Liang et al. |

OTHER PUBLICATIONS

"Ultra-Fine Pitch Fixed Array ACF," Tech on Chinese (Mar. 1, 2011).

Arenholz, E. et al., "Structure formation in UV-laser ablated polyethylene-terephthalate (PET)," Appl. Phys, A 53, pp. 330-331 (abstract) (1991).

Asai, S. et al., "Development of an Anisotropic Conductive Adhesive Film (ACAF) from Epoxy Resins," Journal of Applied Polymer Science, vol. 56, pp. 769-777 (1995).

Brunco, D.P. et al., "Temperature measurements of polyimide during KrF excimer laser ablation," J. Appl. Phys., 72 (9), pp. 4344-4350 (Nov. 1992).

Dokoutchaev, A. et al., "Colloidal Metal Deposition onto Functionalized Polystyrene Microspheres," Chem. Mater., 11, pp. 2389-2399 (1999).

Dyer, P.E. et al., "Excimer laser ablation and thermal coupling efficiency to polymer films," J. Appl. Phys., 57 (4), pp. 1420-1422 (Feb. 1985).

Elaboudi, I. et al., "Underwater excimer laser ablation of polymers," Applied Physics A, 92, pp. 743-748 (2008).

Jang, D. et al., "Liquid-Assisted Excimer Laser Micromaching for Ablation Enhancement and Debris Reduction," JLMN-Journal of Laser Micro/Nanoengineering, vol. 1, No. 3, pp. 221-225 (2006).

Kim, R. et al., "Application of contrast enhancement layer to 193 nm lithography," J. Vac. Sci. Technol., B 25, p. 2466 (abstract) (2007).

Lazare, S. et al., "High-aspect-ratio microdrilling in polymeric materials with intense KrF laser radiation," Applied Physics A, 69, pp. S1-S6 (1999).

Lazare, S. et al., "Ultraviolet Laser Photoablation of Polymers: A Review and Recent Results," Laser Chem., vol. 10, pp. 25-40 (1989).

Lazare, S., "Improved resolution of submicron KrF laser ablation of polymers by a new filtered imaging irradiation," Proc. SPIE, 5662, p. 249 (abstract) (2004).

Liang, R.-C. et al., "Ultra Fine Pitch Anisotropic Conductive Film with Fixed Array of Conductive Particles," IDW'10 Proceeding, p. 1909, Paper FMC4-4, Fukuoka, Japan (2010).

Liang, R-C. et al., "Fixed-Array Anisotropic Conductive Film (FACF) for Ultra Fine Pitch Applications," ICFPE Proceedings, Paper S1-2-4, Hsinchu, Taiwan (2010).

Lin, Y.C. et al., "A review of the influencing factors on anisotropic conductive adhesives joining technology in electrical applications," J. Mater. Sci., 43, pp. 3072-3093 (2008).

Liu, R. et al., Microarrays, "Chapter 3: Fully Integrated Microfluidics Device for Direct Sample-to-Answer Genetic Analysis," Springer Science, pp. 37-65 (2009).

Microfluidics, Theory and Applications, Kuznetsov, I.A. (ed.), Nova Science Publishers, Inc., pp. 1-54.

Niino, H. et al., "Excimer laser polymer ablation: formation of positively charged surfaces and its application into the metallization of polymer films," Surface Sci., 69 (1-4), 1 (abstract) (1993).

Niino, H. et al., "Surface morphological microstructures of poly(ethylene 2,6-naphthalate) modified by excimer laser ablation," Appl. Phys. Lett., 54 (21), pp. 2159-2161 (May 1989).

Oldham, W.G., "The Use of Contrast Enhancement Layers to Improve the Effective Contrast of Positive Photoresist," IEEE Transactions on Electron Devices, vol. ED-34, No. 2, pp. 247-251 (Feb. 1987).

Reiser, A., Photoreactive Polymers, John Wiley & Sons, NY, pp. 246-250 (1989).

Schmidt, H. et al., "Ultraviolet laser ablation of polymers: spot size, pulse duration, and plume attenuation effects explained," Journal of Applied Physics, vol. 83, No. 10, pp. 5458-5468 (May 1998).

Shin, D.S. et al., "Correction of a coherent image during KrF excimer laser ablation using a mask projection," Optics and Lasers in Engineering, 44, pp. 615-622 (2006).

Srinivasan, R. et al., "Ultraviolet Laser Ablation of Organic Polymers," Chem. Rev., 89, pp. 1303-1316 (1989).

Tokarev, V.N. et al., "High-aspect-ratio microdrilling of polymers with UV laser ablation: experiment with analytical model," Applied Physics A, 76, pp. 385-396 (2003).

(56) References Cited

OTHER PUBLICATIONS

Ugelstad, J. et al., "Biomedical Applications of Monodisperse Magnetic Polymer Particles," Future Directions in Polymer Colloids, El-Aasser and Fitch (ed), Martinus Nijhoff Publishers, pp. 355-370 (1987).

Ugelstad, J. et al., "Swelling of Oligomer-Polymer Particles, New Methods of Preparation of Emulsions and Polymer Dispersion," Advances in Colloid and Interface Science, 13, pp. 101-140 (1980).

Wagner, F. et al., "Novel structure formation in poly(ethylene therephthalate) by scanning excimer laser ablation," Applied Surface Science, 154-155, pp. 627-632 (2000).

Wagner, F. et al., "Structure formation in excimer laser ablation of stretched poly(ethylene therephthalate) (PET): the influence of scanning ablation," Applied Physics A, 69, S841-S844 (1999).

Watanabe, H. et al., Laser Ablation of Poly(ethylene terephthalate), J. Appl. Polym. Sci., 64(6), pp. 1203-1209 (1997).

Weisbuch, F. et al., "Viscosity of transient melt layer on polymer surface under conditions of KrF laser ablation," Applied Surface Science, 186, pp. 95-99 (2002).

Zheng, H.Y. et al., "Studies of KrF laser-induced long periodic structures on polyimide," Optics and Lasers in Engineering, 47, pp. 180-185 (2009).

\* cited by examiner

Figure 1E
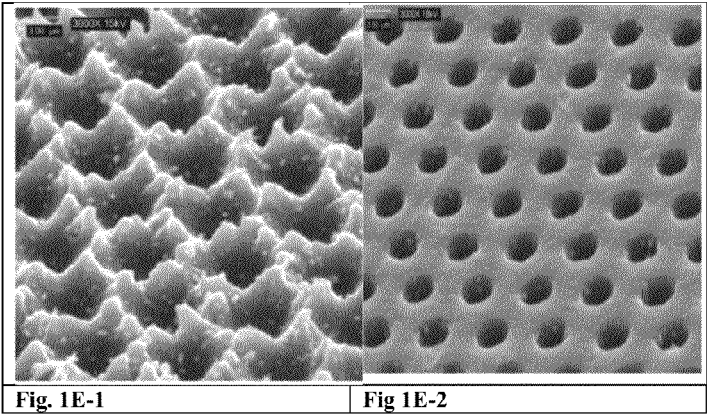
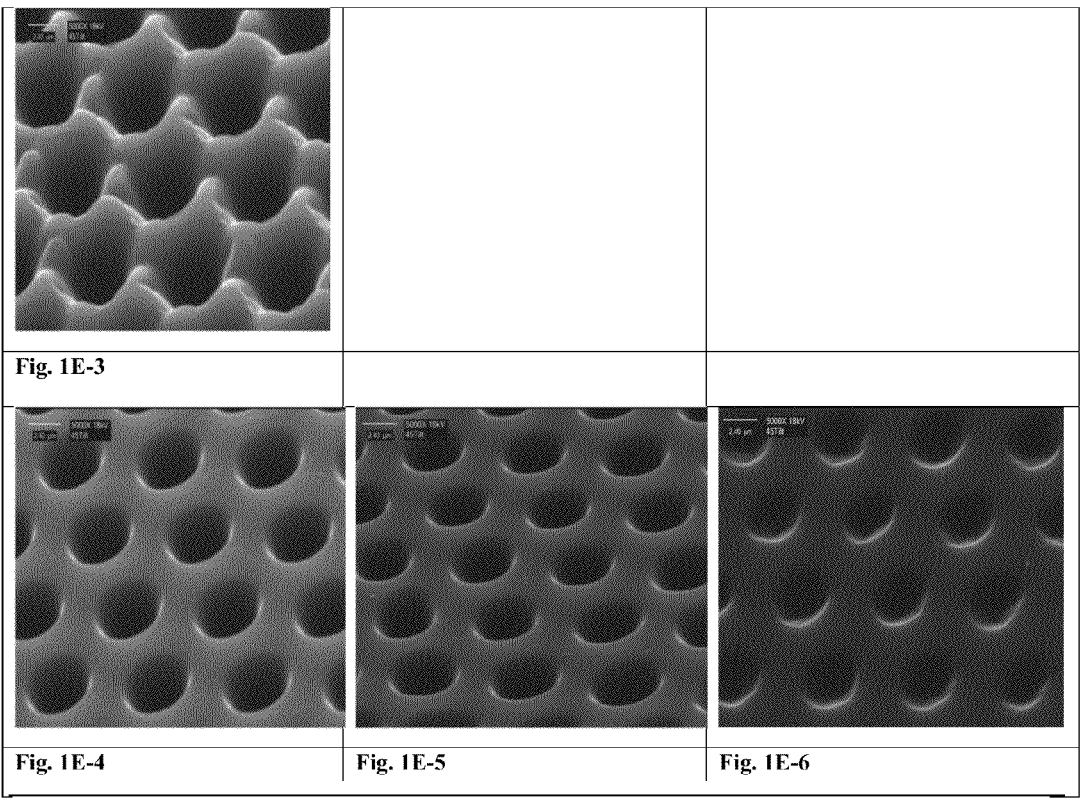

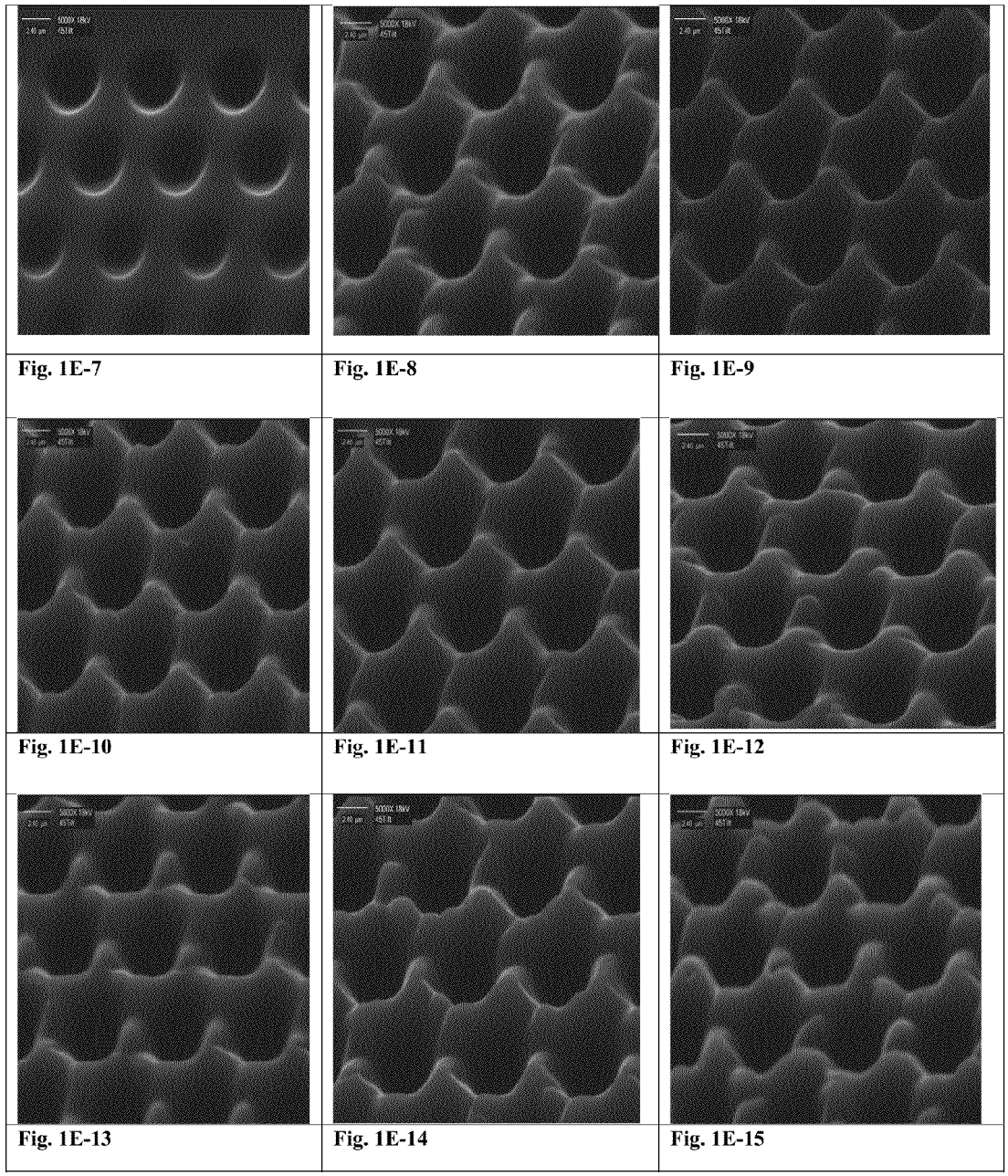

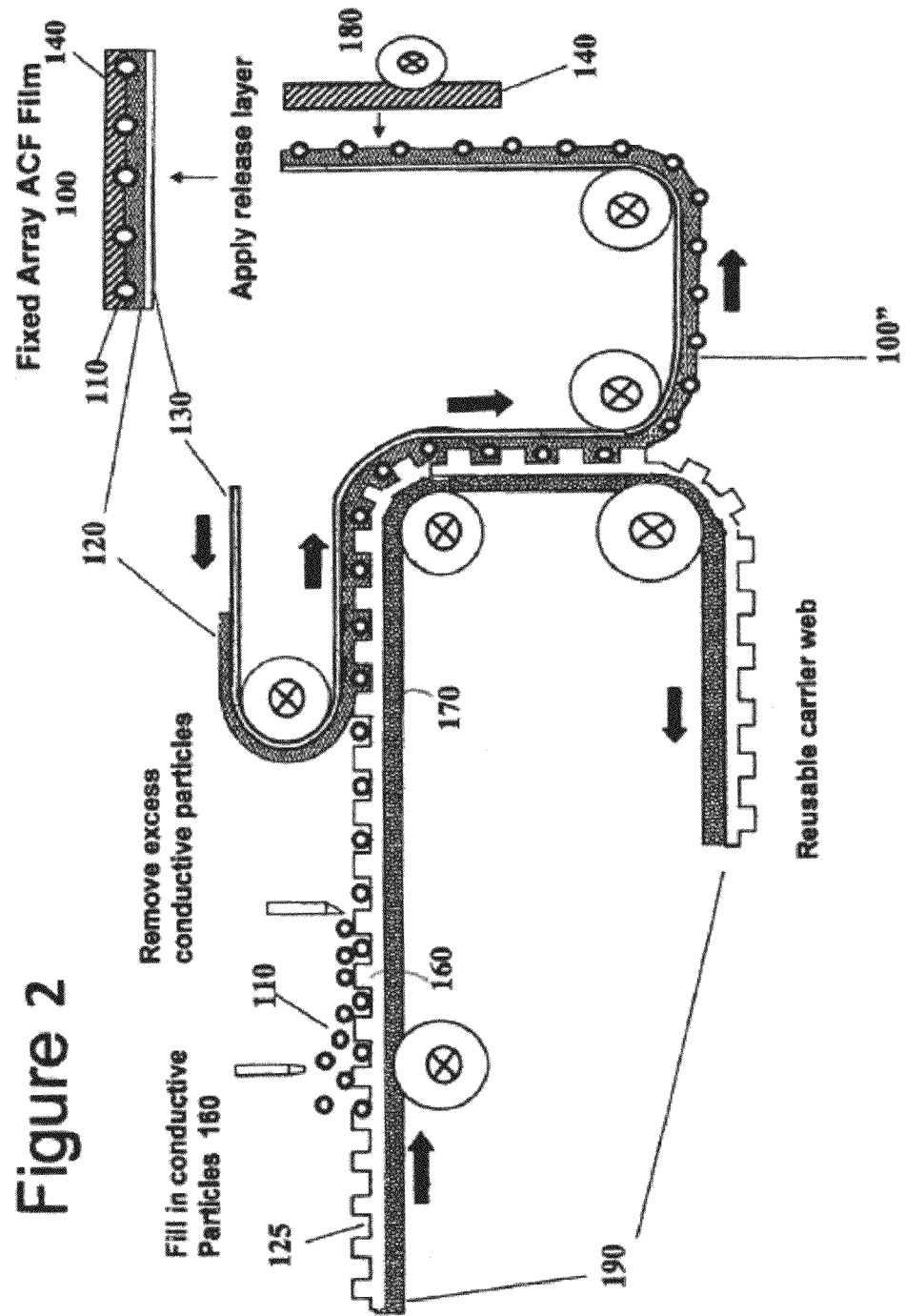

MICROCAVITY CARRIER WITH IMAGE ENHANCEMENT FOR LASER ABLATION

FIELD OF INVENTION

This invention relates to a method for manufacturing electronic devices and components such as anisotropic conductive films (ACF). This invention represents an improvement in the invention disclosed in U.S. Published Application 2010/0101700 to Liang et al. ("Liang '700") in which an Image Enhancement Layer (IEL) is used to form the microcavities in the carrier web by laser ablation.

BACKGROUND OF INVENTION

For a discussion of the background of the invention reference may be made to Liang '700 cited above. Liang '700 discloses a method for manufacturing ACFs having a non-random array of conductive particles by providing a carrier web having a non-random array of microcavities and distributing the conductive particles into the microcavities. Preferably, the particles are distributed on the carrier web so that there is essentially one particle in each cavity. The carrier web is conveyed into contact with an adhesive film and the particles are transferred to the film upon contact.

One method that is used to form microcavities in the carrier web is laser ablation micromachining using for examples, KrF and ArF excimer lasers through a mask. See commonly assigned U.S. Publications 2009/0053859; 2010/0101700; and 2012/0295098 incorporated herein in their entireties by reference.

It has been reported that the local surface temperature of the polymer to be ablated can reach greater than 1000° K with a relatively high pressure ablation plume usually from few tens to few hundreds bars. Microstructure formation due to debris re-deposition and re-solidified lateral material melt flow from the center to the periphery of the laser irradiated spot have been observed. For fine pitch image reproduction particularly those of high aspect ratio (i.e., the height/width or depth/width ratio of an image or image spacing), the resolution achievable by such a process is often severely degraded by the undesirable light diffraction and scattering attributable to the mask used and the aforementioned material melt flow, debris formation and re-deposition induced by the photothermal process.

It has also been reported that improved aspect ratio and resolution can be achieved by using a projection mask with coherent image correction, multi-pulse irradiation of various wavelength on various substrates, filtered irradiation, liquid-assisted or under-water irradiation. However, in all cases, manufacturing of fine-pitch (about <15 um) images of narrow pitch spacing (about <5 um) and high aspect ratio (about >1) of image spacing remains a major challenge, particularly in a roll-to-roll process.

SUMMARY OF THE INVENTION

One manifestation of the invention is a carrier useful in manufacturing device components such as ACFs, chips on film (COF) or chips on glass (COG) wherein the carrier includes a removable scarificial IEL through which microcavities are formed on the carrier by laser ablation.

It has been observed that the microcavity arrays produced in certain embodiments of this invention provide significantly improved reproducibility and wider process windows both in the manufacturing of the microcavity carrier films and in the particle filling and transfer in the roll-to-roll manufacturing of fixed array ACFs as taught in the patent applications cited above and illustrated in FIG. 2. Significant improvements in both the filling efficiency (i.e., the percentage of particles captured by the microcavities) in the filling process and the release efficiency of the microcavity web or loop from the adhesive layer in the particle transfer process have been observed. While not to be bound by theory, it is believed that the sacrificial IEL effectively prevents debris and the low molecular weight laser-degraded or photolysis/thermolysis material melt from directly contacting or forming a strong adhesion/cohesion with the substrate. The low molecular weight laser-degraded or photolysis/thermolysis materials tend to be quite polar and sometimes charged. They tend to be quite sticky but were removed or washed away in the subsequent image development processes that dissolve or strip the IEL. As a result, the microcavity carrier webs or loops of this invention showed a significantly better release properties against the adhesive layer in the particle transfer process. On the other hand, the improvements observed in the particle filling process are believed to be the direct consequence of the better defined cavity partition and profile obtained using the IEL which may better contain the particles during the roll-to-roll fluidic particle filling process.

One manifestation of the invention is a carrier belt which comprises a substrate and a image enhancement layer (IEL) overcoating the substrate wherein the IEL is laser ablatable and prevents laser-degraded materials from interfering with formation of microcavities and enables the production of a microcavity carrier having fine pitch, high resolution and high aspect ratio.

Another manifestation of the invention is a process for manufacturing an electronic device such as an ACF using a carrier sheet, web or belt having an array of microcavities formed in the carrier by laser ablation. The microcavities are filled with conductive particles and the carrier web is used in a manner analogous to the web in the process disclosed in the Liang '700 publication or in a roll-to-roll process.

Another manifestation of the invention is a carrier sheet, belt or web having an IEL in which the microcavities are arranged in a non-random but variable pattern to reduce the effect of periodic defects.

Still another manifestation of this invention is a non-random microcavity carrier sheet, belt or web with microcavities of high resolution and high cavity density for microfluidic devices, microfluidic assembly processes and applications.

BRIEF DESCRIPTION OF THE DRAWINGS

FIG. 1E-1 to FIG. 1E-15 are SEM micrographs of various PET substrates with and without an overcoat of about 0.5 um of a IEL using a staggering 6-8 um pitch photomask with repeated circular openings of 5 um diameter and partitions of 3 um wide. Unless specified otherwise, the laser energy was adjusted in all cases to produce a microcavity carrier having cavities of about 4-5 um depth. All of the SEM photographs shown in the Figures were taken after the IEL was stripped.

FIG. 1E-1 is provided for comparison and is an SEM photograph of the microcavities formed in a carrier consisting of a pigmented PET (MELINEX 339® from DuPont Teijin Films) that does not include a IEL and FIG. 1E-2 is an SEM photograph of the microcavities formed on the MELINEX 339® substrate precoated with an IEL of about 0.5 um thickness formed from PKFE (a phenoxy resin from InChem. Corp., South Carolina), in accordance with one embodiment of the invention.

FIG. 1E-3 is an SEM photograph of the microcavities formed on a clear PET MELINEX 454® film and FIGS. 1E-4 to 1E-15 are photographs of the microcavities formed on the MELINEX 454® film precoated with an IEL of about 0.5 um thickness, formed from phenoxy resins PKHB (FIG. 1E-4) and PKCP (FIG. 1E-5), both from InChem. Corp.; Novolac resins Rezicure™ 3500 (FIG. 1E-6) and 3100 (FIG. 1E-7), both from SI Group, NY; Polystyrene, Mw=35,000 (FIG. 1E-8), Polystyrene-maleic anhydride copolymer, Mw=1,700 (FIG. 1E-9), Poly(styrene-co-methyl methacrylate), Mw=30,000 (FIG. 1E-10), PMMA, Mw=350,000 (FIG. 1E-11), Polyvinyl alcohol, 88% hydrolyzed, Mw=30,000 (FIG. 1E-12), polyvinyl butyral, Mw=50,000 (FIG. 1E-13), Cellulose acetate butyrate Mw=50,000 (FIG. 1E-14), all from Sigma-Aldrich and PE-Wax ME48040M2 from Michelman, Inc., OH (FIG. 1E-15).

FIGS. 1F-1 and 1F-2 are SEM photographs of the microcavities formed on poly(ethylene naphthalate), PEN Q51 film from DuPont Teijin Films without and with an IEL of about 0.5 um thickness formed from PKHB, respectively.

FIGS. 1G-1 and 1G-2 are SEM photographs of the microcavities formed on Kapton® Polyimide VN-300 film from DuPont respectively without and with an IEL of about 0.5 um thickness formed from PKHB.

FIG. 2 is a schematic illustration of a manufacturing process in accordance with one embodiment of the invention in which the carrier web or belt is used to form an ACF in a roll-to-roll transfer process in which conductive particles are transferred from the microcavities to a juxtaposed adhesive layer as disclosed in Liang '700.

FIG. 3 is a schematic illustration of a laser projection system used in one embodiment of the invention for forming the microcavities in the carrier web.

DETAILED DESCRIPTION

Liang '700 is incorporated herein, in its entirety, by reference.

Figure 1A:
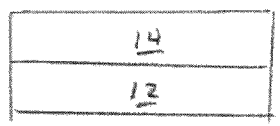
FIGS. 1A-1B are cross-sectional schematic views of a carrier sheet, web or belt in accordance with one embodiment of the invention.
Figure 1B:
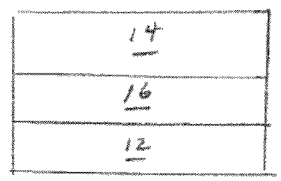
Figure 1C:
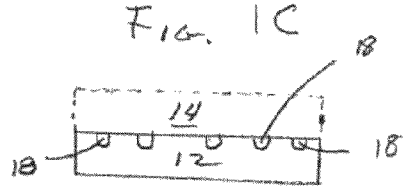
FIGS. 1C and 1D are schematic cross-sectional views of the carrier sheet, web or belt of FIGS. 1A and 1B showing the position of the microcavities formed in the substrates by laser ablation in accordance with two embodiments of the invention.
Figure 1D:
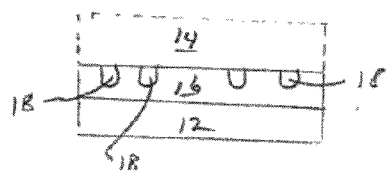
Figure 1F:
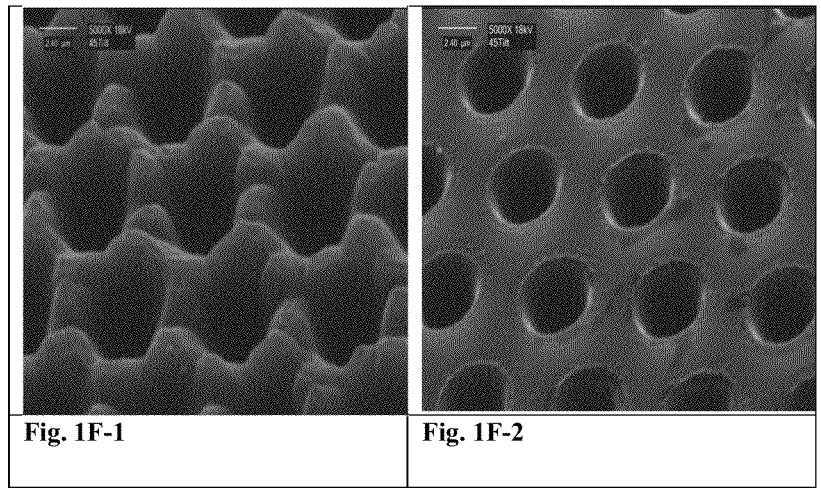
Figure 1G:
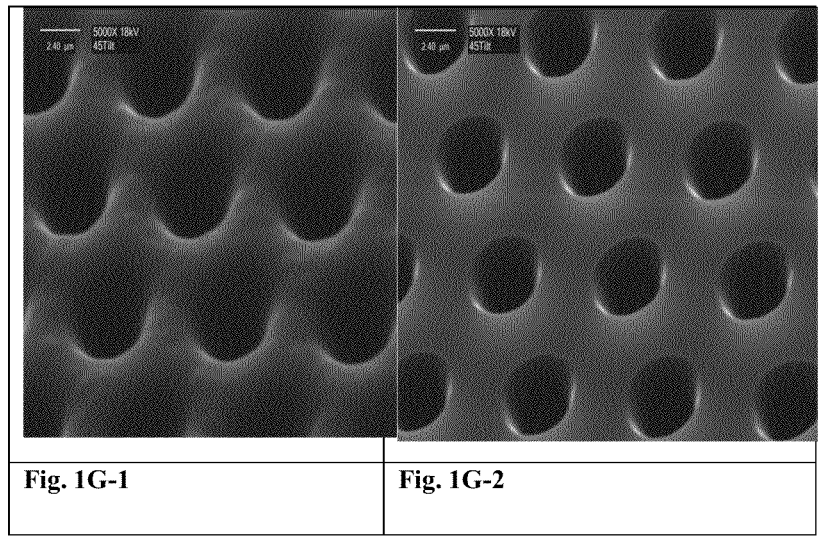

FIG. 1A is a cross-sectional view of a carrier sheet, web or belt 10 in accordance with one embodiment of the invention. The carrier sheet 10 includes a substrate 12 which is overcoated with a IEL 14 that may be directly bonded to the substrate 12. In another embodiment, as shown in FIG. 1B, the carrier 10 may optionally include an intermediate cavity-forming layer 16 which may be interposed between the IEL layer 14 and the substrate 12. In a particular embodiment the substrates 12 are formed by polyethylene terephthalate (PET), PEN, polyimide, etc., and the IEL 14 is a thin overcoat of an imaging enhancement sacrificial layer such as the PKFE and PKHB phenoxy resins (identified below). The microcavities are able to provide ultra-fine pitch and spacing FIGS. 1C and 1D illustrate the carrier shown in FIG. 1A after formation of the microcavities 18 in the carrier 10 by laser ablation and after removal of the IEL layer 14 as shown by dotted lines.

To form the IEL on the substrate 12 or the cavity forming layer 16, the materials for forming the IEL may be dissolved or dispersed in solvents such as water, alcohol, ethyl acetate, i-propyl acetate, acetone, MEK, cyclohexanone, THF, alkoxyethers, and toluene . . . etc. and coated onto the substrate by for examples, doctor blade, wire bar, slot or slit die, gravure, reverse rolls and curtain coating. Vacuum deposition, chemical vapor deposition, conformation and plasma coatings may also be used for thin coatings. In some cases, they may be coated in the latex or emulsion forms. Optionally wetting agents such as Silwet, Triton, and Pluronic surfactants may be used to improve the coating quality. Unless specified otherwise, the coating thickness was controlled to be about 0.05 to 4 μm, preferably about 0.2 to 2 μm, even more preferably about 0.5 to 1.5 μm. Too thin a coating tends to result in pin-holes and insufficient barrier properties to resist the material melt flow produced during the ablation process. Too thick a coating, on the other hands, may result in waste of laser energy or microcavities of a narrower opening or sharrower depth. After ablation, the IEL and the ablation debris are stripped away by a solvent or cleaning solution and/or by physical peel-off using a adhesive tape such as Tape 364 from Surface Armor, Tex. to develop the microcavity array on the substrate or the cavity forming layer.

Figure 3:
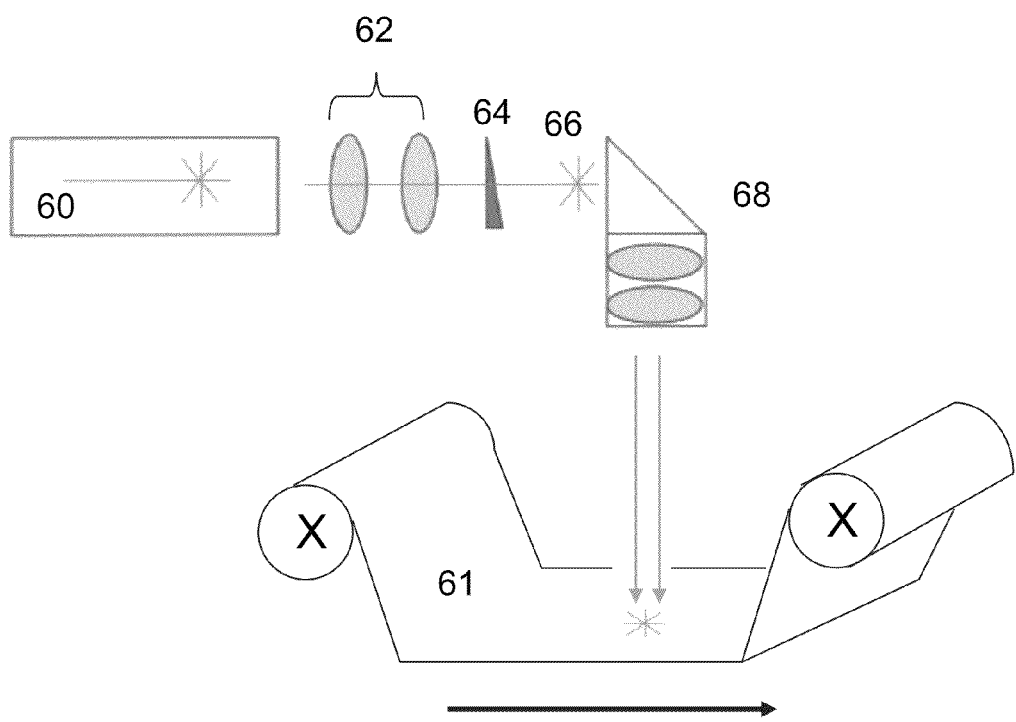

In one embodiment a process analogous to the ACF production station shown in FIG. 3 of Liang '700 may be modified to include a laser ablation device instead of an embossing device for making a plurality of microcavities by a laser ablation at a first stage of a ACF production station. The microcavity array may be formed directly on the substrate 12 as shown in FIG. 1A or on a cavity-forming layer 16 pre-applied to the substrate 12 as shown in FIG. 1B. In one embodiment suitable materials for the substrate include, but are not limited to polyesters such as polyethylene terephthalate (PET) and polyethylene naphthalate (PEN), polycarbonate, polyamides, polyacrylates, polysulfone, polyethers, polyimides (PI), and liquid crystalline polymers and their blends, composites, laminates or sandwich films.

It was found that significant improvement in image resolution and contrast may be obtained by overcoating the substrates-to-be-ablated with a thin ablate-able sacrificial image enhancement layer 14. Not to be bound by any theory, it is believe that the removable sacrificial IEL reduces (1) the detrimental effect due to the scattered or diffracted light from the mask, and/or (2) the probability of forming a strong adhesion or cohesion between the debris or re-deposited melt material and the substrate. Images of high resolution and contrast, particularly those of very fine spacing (e.g., pitch less than about 15 μm and spacing less than about 5 μm) and high aspect ratio (e.g., greater than about 1 in terms of the microcavity, the microcavity partition walls, or the spacing between the microcavities) may be developed by removing the IEL using a wet development process such as solvent dissolution/washing or a dry development process such as peeling-apart or dry etching. The improvement in resolution, image sharpness and contrast can been seen very clearly in the FIGS. 1E-1 and 1E-15 and 1F-1 and 1F-2 and 1G-1 and 1G-2.

The IEL overcoat layer may be about 0.05 to about 4 μm in one embodiment about 0.2 to about 2 μm in a more a particular embodiment of the invention. The substrate layer is about 10 um to 200 μm thick and more particularly about 50 μm to 150 μm thick in select embodiments of the invention. In one embodiment the IEL resin is selected from a group including phenoxy resin, phenolic resin, polycarbonate, polystyrene, polyarylethers, polyarylsulfone and their copolymers or blends. Phenoxy and phenolic resins are particularly useful because they are ablateable and are of strong extinction coefficients in the wavelength of most excimer laser light. They also provide excellent adhesion to the substrate 12 or the cavity forming layer 16 (if present) and their resistance to the debris melt flow formed during laser ablation. After ablation, the IEL as well as the ablation debris were stripped as described earlier to reveal microcavities of high contrast and partition walls of high aspect ratio and smooth surface. These microcavities are particularly useful for ACFs and for high yield microfluidic particle distribution processes.

Representative examples of useful phenoxy resins include, but are not limited to PKFE, PKHB and PKCP, all from InChem Corp. Representative phenolic resins include, but are not limited to novalac resins from Shipley, Mass. and Georgia-Pacific and Rezicure™ cresol or other alkylphenol novolac resins from SI Group. Other examples of useful IEL resins include, but are not limited to, polyphenylene, polycarbonate, polyarylether, polyarylsulfone, and their copolymers or blends. The SEM micrograph of the microcavities of 6-8 um pitch, 5 um diameter and 3-4 um depth, obtained by direct ablation on the substrates without any IEL are shown in FIG. 1E-1 (pigmented PET), FIG. 1E-3 (clear PET), FIG. 1F-1 (PEN) and FIG. 1G-1 (PI). With the exception of the polyimide (FIG. 1G-1), the partition walls of such fine pitch microcavity arrays are distorted severely by the ablation process. Although the ablation of the polyimide substrate showed less severe distortion, it was observed that the direct ablation on the polyimide film produced a significant amount of undesirable dark debris which was very difficult to remove by vacuum and/or air blow during the ablation process. In contrast, the debris formed during the ablation on the IEL overcoated polyimide film showed a significantly less tendency to stick onto the IEL layer and was relatively easy to be removed by air blow or vacuum. The use of the IEL on the polyimide film in a way improve the efficiency of a continuous ablation process without the need to clean the substrate or optics for alignment in the automatic roll-to-roll vision recognition process. For comparison, the SEM micrographs of the same substrate with a phenoxy or phenolic/novolac IEL overcoat of about 0.5 µm thickness are shown in FIG. 1E-2 (pigmented PET/PKFE), FIG. 1E-4 (PET/PKHB), FIG. 1E-5 (PET/PKCP), FIG. 1E-6 (PET/Novolac Resicure 3500), FIG. 1E-7 (PET/Novolac Resicure 3100), FIG. 1F-2 (PEN/PKHB) and FIG. 1G-2 (Polyimide/PKHB). In all cases, the microcavities produced with phenoxy or phenolic IEL overcoat showed significant improvements in contrast, aspect ratio and smoothness of partition walls after the IEL were stripped off. The IEL provided a significantly wider process window in the microfluidic particle distribution process. It was also observed that the debris produced during ablation could be removed easily by vacuum and/or blown air. Equally importantly, the microcavity webs or loops produced with the IEL also showed a significantly better release properties and in the manufacturing of a non-random array ACF, resulted in a significantly high yield rate with a much wider process window in particle transfer processes.

Table 1 shows the effect of the IEL on the adhesion between three ablated substrates and a 5 mm wide adhesive tape Polyken 781 from Berry Plastics Corp. Indiana. The adhesive tape was laminated onto the ablated substrates at room temperature with a hand roller and the peeling adhesion was measured with a TA-XT2i Texture Analyzer from Texture Technologies Corp., NY at a speed of 5 cm/min and a peeling angle of 90°.

TABLE 1

Effect of IEL on the adhesion of the ablated substrate to adhesive tape Polyken 781

| Ablation Substrate | IEL Used | Peeling Force (N/5 mm) |
|---|---|---|
| Kapton ® N300 | No | 0.50 |
| Kapton ® VN300 | PKHB of about 0.5 µm | 0.45 |
| PEN Q51 | No | 0.70 |

TABLE 1-continued

Effect of IEL on the adhesion of the ablated substrate to adhesive tape Polyken 781

| Ablation Substrate | IEL Used | Peeling Force (N/5 mm) |
|---|---|---|
| PEN Q51 | PKHB of about 0.5 µm | 0.60 |
| PET MELINEX 454 ® | No | 0.60 |
| PET MELINEX 454 ® | PKHB of about 0.5 µm | 0.55 |

It can be seen clearly that in all cases, the use of the IEL (PKHB of about 0.5 µm thickness) reduced the adhesion of the ablated substrate to the adhesive tape. It resulted in a significant improvement in the process widow of the particle transfer process.

More SEM micrographs of microcavities produced with various IEL overcoats on clear PET are shown in FIG. 1E-8 (PET/PS (polystyrene)), FIG. 1E-9 PET/SMA (polystyrene-co-maleic anhydride)), FIG. 1E-10 (PET/polystyrene-co-methyl methacrylate), FIG. 1E-11 (PET/PMMA (polymethyl methacrlate)), FIG. 1E-12 (PET/PVA (polyvinyl alcohol)), FIG. 1E-13 (PET/PVB (polyvinyl butyral)), FIG. 1E-14 PET/CAB (cellulose acetate butyrate)) and FIG. 1E-15 (PET/PE wax). Only limited improvements in the microcavity contrast or partition wall distortion was observed in cases of the polystyrene and related copolymers although all of they provide an easier cleaning of the ablation debris than the control sample without the overcoat. Not to be bound by theory, it is believed that those materials (PMMA, PVA, PVB, CAB and PE) with a low extinction coefficient in the laser output wavelength range did not exhibit a contrast enhancement effect against light scattering or diffraction, although they provided a barrier between the debris and the substrate.

Optionally, the carrier may include an ablate-able cavity-forming layer that is interposed between the substrate and underlies the overcoated IEL. The cavity-forming layer can include, without limitation, a thermoplastic material, a thermoset material or its precursor, a positive or a negative photoresist, or an inorganic material. Representative examples of such cavity forming layers include, but are not limited to, polycarbonate, polyimide (PI), polyaryl ethers, polyaryl esters, polysulfone, polyaryl silicones and their copolymers or blends/composites.

FIG. 2 illustrates a reusable carrier web or belt 190 having an array of microcavities 125 on its surface in accordance with one embodiment of the invention. The carrier web 190 includes a substrate. In one embodiment, the microcavity array 125 is formed directly on the carrier web 190. In another embodiment the microcavity array 125 is formed in the cavity-forming layer 160 on the underlying substrate carrier web 170. Suitable materials for the carrier web 170 include, but are not limited to, polyesters such as polyethylene terephthalate (PET) and polyethylene naphthalate (PEN), polycarbonate, polyamides, polyacrylates, polysulfone, polyethers, polyimides (PI), and liquid crystalline polymers and their blends, composites, laminates or sandwich films. In one embodiment, the carrier web is VN300™ a Kapton® (aromatic polymide) film available from DuPont.

To achieve a high yield of particle transfer, in one embodiment of the invention after ablating the carrier to form the microcavities, the surface of the carrier web may be treated with a thin layer of release material (not shown) to reduce the adhesion between the microcavity carrier web 190 and the adhesive layer 120. Optionally, a release layer may be applied by coating, printing, spraying, vapor deposition, thermal transfer, or plasma polymerization/crosslinking either before or after the microcavity-forming step. As disclosed in Liang '700, suitable materials for the release layer include, but are not limited to, fluoropolymers or oligomers, silicone oil, fluorosilicones, polyolefins, waxes, poly(ethyleneoxide), poly (propyleneoxide), surfactants with a long-chain hydrophobic block or branch, or their copolymers or blends.

The microcavities may be formed in the web using a laser ablation process. In one embodiment different shape and dimension patterns were fabricated using UV excimer laser ablation on a polyimide or PET web through a photomask. Shape and dimension of the produced micron patterns and pattern arrangements are pre-determined by the photomask design. The varieties of the patterns dimension, shapes and spacing are disclosed in US Publication 2006/0280912 and Liang '700. The fixed array patterns may vary. In the case of circular microcavities, the pattern may be represented using the designation X-Y where X is the diameter of the cavity and Y is the edge-to-edge distance between the adjacent cavities in microns. Typical microcavity pattern pitches include 5-3, 5-5, 5-7, and 6-2 patterns. The pattern selected will depend in part on the number of particles required for each electrode. To increase the particle density and/or reduce the minimum bonding area of electrodes, the microcavity pattern may be staggered.

FIG. 3 shows one example of a mask-based laser projection ablation system in which the laser beam 60 passes through beam shaping optics 62 to even out the laser intensity. The desired microcavity pattern arrangement is generated thru the photomask 64 to yield a plurality of laser beams 66 having the desired dimension and shape. The beam intensity or the number of beam pulses is adjusted in conjunction with a projection lens system 68 to produce microcavities in the web 61 having the desired opening and depth. The lens system 68 can be used for optical reduction. In one embodiment, the cavity-to-cavity distance may be offset or randomized in a controlled manner to reduce the effect of periodical line defects during bonding. In one embodiment, the size of the cavities may be selected such that each cavity accommodates only one conductive particle. In one embodiment the conductive particles and the microcavities are about 2 to 10 microns in diameter or across the cavity in the case of noncircular cavities.

In accordance with one embodiment of the invention, the microcavities are positioned to reduce the effect of periodic/repetitive line defects in the conductive particle pattern. A controlled but variable adjustment is made in the position of the microcavities to prevent these defects as disclosed in U.S. application Ser. No. 13/233,360 which is incorporated herein by reference.

Deposition of the conductive particles 110 may be effected by applying a fluidic particle distribution process and entrapping process, in which each conductive particle is entrapped into a single microcavity 125. There are a number of entrapping processes that can be used. For example, a roll-to-roll continuous fluidic particle distribution process can be used to entrap only one conductive particle into each microcavity.

In one embodiment, the microcavity loop is placed onto a particle filling coater with cantilever rollers. A 3 to 6 wt % dispersion of conductive particles in isopropyl alcohol (IPA) was mixed by mechanical stirring and dispensed by a fluidic process via for examples a slot or slit coating die, a curtain, or a spraying nozzle through a L/S 13 tubing with a Masterflex pump available from Cole Parmer. Conductive particles were filled into microcavities using a 100% knitted polyester wiper wrapped roller. Excess particles (outside of the microcavity) were carefully removed using a polyurethane roller from Shima American Co., with a vacuum device to recycle conductive particles. The recovered particles may be collected and recirculated to the supply hopper for reapplication to the web 190. In one embodiment, more than one dispensing station 110 may be employed to ensure that a conductive particle 112 is entrapped in each microcavity 125 and thereby minimize or reduce the number of microcavities not containing particles.

The entrapped particles 110 then can be transferred from the microcavity array to predefined locations on an adhesive layer 120. Typically, the distance between these transferred conductive particles must be greater than the percolation threshold, which is the density threshold at which the conductive particles become connected or aggregate. In general, the percolation threshold is a function of the structure/pattern of the microcavity array structure and to the plurality of conductive particles.

It can be desirable to employ one or more processes to remove excess conductive particles, for example, after fluidic assembly. Roll-to-roll continuous fluidic particle distribution processes may include a cleaning process to remove excess conductive particles from the top of microcavity array. A cleaning process may be a non-contact cleaning process, a contact cleaning process, or an effective combination of non-contact and contact cleaning processes.

Certain exemplary embodiments of the particle cleaning process, employ a non-contact cleaning process, including, without limitation, one or more of a suction process, an air blow process, or a solvent spray process. Removed excess conductive particles can be accumulated, for example, by a suction device for recycle or reuse. The non-contact suction process can further be assisted by dispensing a cleaning fluid such as, without limitation, by spraying a solvent or a solvent mixture, to improve the cleaning efficiency. Certain other exemplary embodiments of the present invention may employ a contact cleaning process to remove the excess conductive particles from the surface of the microcavity array. The contact cleaning process includes the use of a seamless felt, a wiper, a doctor blade, an adhesive material, or a tacky roll. When a seamless felt is applied, a suction process also may be used to recycle conductive particles from the seamless felt surface and to refresh the felt surface. In this felt/suction process, both capillary force and suction force draw the excess conductive particles with suction force applied from inside of seamless felt to remove and recycle the excess particles. This suction process can be further assisted by dispensing a cleaning fluid, a solvent, or a solvent mixture to improve the cleaning efficiency.

After the fluidic filling step 160, the conductive particles in the microcavities may be transferred to the substrate 130, which is pre-coated with an uncured adhesive 120 or which is coated on the process line. The microcavity belt 190 is reused by repeating the particle filling and transferring steps.

As shown in FIG. 2, the adhesive composition 120 is provided on a substrate or release film 130. The adhesive composition may be an epoxy composition. In one embodiment, it may be the composition disclosed in U.S. Published Applications 2010/0317545, 2010/0101700, 2009/0181165; U.S. Pat. Nos. 7,923,488; 4,740,657; 6,042,894; 6,352,775; 6,632, 532; J. Appl. Polymer Sci., 56, 769 (1995) and J. Mater. Sci., (2008) 43, 3072-3093, which are herein incorporated by reference in their entirety. In one embodiment, the adhesive contains core-shell rubber particles such as Dow Chemical Company EXL2335 or a thermoplatic elastomer such as Nanostrength® acrylic block copolymers from Arkema, Inc., PA, in an amount of about 0.5 to 10 weight % as a toughening agent or a compatibilizer of the ingredients.

To achieve high yield of particle transfer from the microcavity loop to the adhesive layer 120, the cohesion strength of the adhesive layer 120 should be no less than the adhesion strength between the adhesive layer and the microcavity array 125; the adhesion strength between the adhesive layer 120 and microcavity array 110 should be less than the adhesion strength between the adhesive layer 120 and the substrate 130 (release liner) that carries the adhesive layer 120. The adhesion strength of the adhesive to the microcavity array film or the release liner may be controlled by the properties of the release coating and the microcavity array film, the adhesive composition, and the use of surface treatment including corona and plasma treatments or a combination thereof.

In accordance with one embodiment of the invention, the coated adhesive may be pre-conditioned or annealed before contacting the microcavity belt. Pre-conditioning temperatures are typically higher than the heat distortion or glass transition temperature of the polymer used in the adhesive and lower than the onset temperature at which the adhesive starts to cure. In one embodiment, the glass transition temperature of the polymer or resin forming the adhesive is about 10° C. to 20° C. and the onset curing temperature of the adhesive is about 60° C. to 75° C., both measured by DSC at a heating rate of 5° C./min. Under these conditions, a pre-conditioning or annealing temperature of about 20 to 30° C. is useful.

In some case, it is advantageous to use an adhesive layer exhibiting a modulus gradient across adhesive thickness, with a higher modulus on the release liner side and lower modulus on the adhesive side. The modulus gradient can be achieved by introducing a trace amount of solvent from conductive particle distribution process, by adjusting the temperature gradient introduced during transfer process, or by both. A temperature gradient may be achieved by applying a surface heating source, by using a heat sink from the release liner, or both. The surface heating source can be, without limitation, a heated roll source, an infrared source, a hot air source, or a wire source. Suitable combinations of these exemplary sources also may be desirable.

In one embodiment the adhesive layer 120 is disposed on a ACF substrate 130 such as polyethylene terephthalate (PET) and polyethylene naphthalate (PEN), polycarbonate, polyamides, polyacrylates, polysulfone, polyethers, polyimides (PI), and liquid crystalline polymers film. After the conductive particles are transferred, the film is slit and wound into reels. The backside of the substrate then contacts the top surface of the adhesive. In this scenario, the adhesion between the adhesive and the back of the substrate should be lower than the adhesion between the adhesive to the front (the coated side) of the substrate to ensure a proper handle-ability of the ACF.

A non-limiting exemplary embodiment of a conductive particle transfer process can employ a differential shear process between the adhesive layer and the microcavity array. The differential shear is achieved by web speed differentiation between the adhesive coated release liner and the microcavity array. The web speed of release liner can be slightly higher or lower than that of the microcavity array.

After the conductive particles are transferred to the adhesive layer, the particles can be partially embedded in the adhesive layer. These partially embedded conductive particles can improve the ACF bonding performance with higher adhesion strength particularly when a low bonding pressure is used, reduced voids, and lower contact resistance. Optionally, after the conductive particles are transferred to the adhesive layer, the adhesive layer may further be treated to have a modulus gradient and a viscosity gradient built across the adhesive layer, with the side of adhesive surface bearing the conductive particles possessing a higher modulus and a higher viscosity. This higher modulus and higher viscosity can help to maintain the conductive particles at their non-random array location during ACF bonding applications. The viscosity gradient across adhesive layer can be achieved by applying a heating process, including, without limitation, surface radiation, infrared radiation, UV radiation, a or a heated roll heating process. Suitable combinations of these heating processes also can be efficacious.

As disclosed in Liang '700, optionally a second substrate 140 can be applied on the top side of the adhesive layer for protection and improved release property of the adhesive. The adhesion strength between the adhesive layer 120 and the first substrate 130 or the second substrate 140 must be weaker than the cohesion strength of the adhesive layer. The adhesion strength between the adhesive layer 120 and the first substrate 130 must be stronger than the adhesion strength between the adhesive layer 120 and the second substrate 140. The adhesion strength between the adhesive layer 120 and the first substrate 130 must be weaker than the adhesion strength between the adhesive layer and the bonding substrate (not shown), such as print circuit board, flexible print circuit board, polymer film, glass, etc., to be able to release the substrate after the pre-bonding process of ACF bonding application.

The resultant film 100 may be used directly as a non-random array ACF schematic wherein the conductive particles 110 are on the top of the adhesive film 120 and may not be covered completely by the adhesive. Optionally, an additional thin layer of adhesive layer may be over-coated onto the as-transferred particle layer to improve the tackiness of the non-random array ACF film, particularly when the particle concentration is high. An adhesive different from that for the adhesive film 120 may be employed for the overcoating.

The film 100" may further be laminated at the lamination station 180 with a substrate 140 which is optionally precoated with an adhesive, to result in a non-random array ACF 100 sandwiched between two substrates 130 and 140. The adhesion strengths between the adhesive 120 and the two substrates 130 and 140 should be lower than the cohesion strength of the adhesive. To facilitate the sequential peeling of the two substrates from the adhesive during bonding, it is preferable that one of the adhesion strengths is substantially larger than the other.

The adhesives used in the above-mentioned processes may be thermoplastic, thermoset, or their precursors. Useful adhesives include but are limited to pressure sensitive adhesives, hot melt adhesives, heat or radiation curable adhesives. The adhesives may comprise for examples, epoxide, phenolic resin, amine-formaldehyde resin, polybenzoxazine, polyurethane, cyanate esters, acrylics, acrylates, methacrylates, thiol-ene, vinyl polymers, rubbers such as poly (styrene-co-butadiene) and their block copolymers, polyolefins, polyesters, unsaturated polyesters, vinyl esters, polycaprolactone, polyethers, and polyamides. Epoxide, cyanate esters and multifunctional acrylates are particularly useful. Catalysts or curing agents including latent curing agents may be used to control the curing kinetics of the adhesive. Useful curing agents for epoxy resins include, but are not limited to, dicyanodiamide (DICY), adipic dihydrazide, 2-methylimidazole and its encapsulated products such as Novacure HX dispersions in liquid bisphenol A epoxy from Asahi Chemical Industry, amines such as ethylene diamine, diethylene triamine, triethylene tetraamine, BF3 amine adduct, Amicure from Ajinomoto Co., Inc, sulfonium salts such as diaminodiphenylsulphone, p-hydroxyphenyl benzyl methyl sulphonium hexafluoroantimonate. Coupling agents including, but are not limited to, titanate, zirconate and silane coupling agents such as glycidoxypropyl trimethoxysilane and 3-aminopropyl trimethoxy-silane may also be used to improve the durability of the ACF. The effect of curing agents and coupling agents on the performance of epoxy-based ACFs can be found in S. Asai, et al., *J. Appl. Polym. Sci.,* 56, 769 (1995). The entire paper is hereby incorporated by reference in its entirety.

Suitable conductive particles for one embodiment of the present invention are of a narrow particle size distribution with a standard deviation of less than about 10%, preferably, less than about 5%, even more preferably less than about 3%. The particle size is preferably in the range of about 1 μm to about 250 μm, more preferably about 2 μm to about 50 μm, even more preferably about 2 μm to about 6 μm. The size of the microcavities and the conductive particles are selected so that each microcavity has a limited space to contain only one conductive particle. To facilitate particle filling and transferring, a microcavity having a tilted wall with a wider top opening than the bottom may be employed as shown in Liang '700.

Conductive particles comprising a polymeric core and a metallic shell are particularly preferred. Useful polymeric cores include but are not limited to, polystyrene, polyacrylates, polymethacrylates, polyvinyls, epoxy resins, polyurethanes, polyamides, phenolics, polydienes, polyolefins, aminoplastics such as melamine formaldehyde, urea formaldehyde, benzoguanamine formaldehyde and their oligomers, copolymers, blends or composites. If a composite material is used as the core, nano particles or nano tubes of carbon, silica, alumina, BN, $TiO_2$ and clay are preferred as the filler in the core. Suitable materials for the metallic shell include, but are not limited to, Au, Pt, Ag, Cu, Fe, Ni, Sn, Al, Mg and their alloys. Conductive particles having interpenetrating metal shells such as Ni/Au, Ag/Au, or Ni/Ag/Au are particularly useful for optimum hardness, conductivity and corrosion resistance. Particles having rigid spikes such as Ni, carbon, graphite are useful in improving the reliability in connecting electrodes susceptible to corrosion by penetrating into the corrosive film if present.

The narrowly dispersed polymer particles useful for the present invention may be prepared by for example, seed emulsion polymerization as taught in U.S. Pat. Nos. 4,247, 234, 4,877,761, 5,216,065 and Ugelstad swollen particle process as described in Adv., Colloid Interface Sci., 13, 101 (1980); *J. Polym. Sci.,* 72, 225 (1985) and "Future Directions in Polymer Colloids", ed. El-Aasser and Fitch, p. 355 (1987), Martinus Nijhoff Publisher. In one preferred embodiment of the present invention, monodispersed polystyrene latex particle of about 5μ diameter is used as the deformable elastic core. The particle is first treated in methanol under mild agitation to remove excess surfactant and to create microporous surfaces on the polystyrene latex particles. The thus treated particles are then activated in a solution comprising $PdCl_2$, HCl and $SnCl_2$ followed by washing and filtration with water to remove the Sn4.sup.+ and then immersed in an electroless Ni plating solution (from for example, Surface Technology Inc, Trenton, N.J.) comprising a Ni complex and hydrophosphite at about 90° C. for about 30 minutes to about 50 minutes. The thickness of the Ni plating is controlled by the plating solution concentration and the plating conditions (temperature and time).

The Ni coated latex particle is then placed in an immersion Au plating solution (for example from Enthone Inc.) comprising hydrogen tetrachloroaurate and ethanol at about 90.degree. C. for about 10 minutes to about 30 minutes to form interpenetrating Au/Ni shells having a total metal (Ni+Au) thickness of about 1μ. The Au/Ni plated latex particles are washed with water and ready for the fluidic filling process. Processes for coating conductive shell on particles by electroless and/or electroplating were taught in for examples, U.S. Pat. No. 6,906,427 (2005), U.S. Pat. No. 6,770,369 (2004), U.S. Pat. No. 5,882,802 (1999), U.S. Pat. No. 4,740, 657 (1988), US Patent Application 20060054867, and *Chem. Mater.,* 11, 2389-2399 (1999).

Fluidic assembly of IC chips or solder balls into recess areas or holes of a substrate or web of a display material has been disclosed in for examples, U.S. Pat. Nos. 6,274,508, 6,281,038, 6,555,408, 6,566,744 and 6,683,663. Filling and top-sealing of electrophoretic or liquid crystal fluids into the microcups of an embossed web were disclosed in for examples, U.S. Pat. Nos. 6,672,921, 6,751,008, 6,784,953, 6,788,452, and 6,833,943. Preparation of abrasive articles having precise spacing by filling into the recesses of an embossed carrier web, an abrasive composite slurry comprising a plurality of abrasive particles dispersed in a hardenable binder precursor was also disclosed in for examples, U.S. Pat. Nos. 5,437,754, 5,820,450 and 5,219,462. All of the aforementioned United States Patents are hereby incorporated by reference in their respective entirety. In the above-mentioned art, recesses, holes, or microcups were formed on a substrate by for example, embossing, stamping, or lithographic processes. A variety of materials were then filled into the recesses or holes for various applications including active matrix thin film transistors (AM TFT), ball grid arrays (BGA), electrophoretic and liquid crystal displays.

Having described the invention in detail and by reference to specific embodiments thereof it will be apparent that numerous variations and modifications are possible without departing from the spirit and scope of the following claims.

What is claimed is:

1. A carrier sheet, web or belt comprising a substrate and an image enhancement layer, each of the layers being laser ablatable, the image enhancement layer being deposited directly on the substrate or being deposited on a microcavity forming layer interposed between the IEL and the substrate, and an array of microcavities laser ablated into the IEL and the substrate or the microcavity forming layer, wherein the microcavities are spaced less than about 15 μm apart, and the microcavities are formed with partition walls having an aspect ratio greater than about 0.5.

2. The carrier of claim 1 wherein the IEL is a layer of a material selected from a group consisting of phenoxy resin, novolac resin, polycarbonate, polyarylether, polyarylsulfone, polyarylsilicone, polyaryl ester, polyarylene, polyarylamide, polyarylacrylte, polyarylimide, polystyrene, poly($\square$-methylstyrene), and their copolymers or blends.

3. The carrier of claim 2 wherein the IEL is a layer of phenoxy resin or novolac resin.

4. The carrier of claim 3 wherein the IEL is a layer of PKFE, PKHB, or PKCP, or their blends.

5. The carrier of claim 3 wherein the IEL is a layer of phenol novolac, cresol novolac, resol novolac, alkylphenol novolac or their copolymers or blends.

6. The carrier of claim 1 wherein the microcavities are spaced less than about 5 μm apart.

7. The carrier of claim 6 wherein the partition walls of the microcavities have an aspect ratio greater than about 1.

8. The carrier of claim 1 wherein the array of microcavities are useful in forming a microfluidic device.

9. The carrier of claim 1 wherein the array of microcavities are useful in forming an anisotropic conductive film.

10. A carrier sheet, web or belt comprising a substrate and an image enhancement layer, each of the layers being laser ablatable, the image enhancement layer being deposited directly on the substrate or being deposited on a microcavity forming layer interposed between the IEL and the substrate, and an array of microcavities laser ablated into the IEL and the substrate or the microcavity forming layer, wherein the microcavities are spaced less than about 15 μm apart, and the microcavities are formed with partition walls having an aspect ratio greater than about 0.5, and wherein the IEL is a layer of phenol novolac, cresol novolac, resol novolac, alkylphenol novolac or their copolymers or blends.

* * * * *